US007715233B2

United States Patent
Hwang et al.

(10) Patent No.: US 7,715,233 B2
(45) Date of Patent: May 11, 2010

(54) NON-VOLATILE MEMORY DEVICE

(75) Inventors: Kyung Pil Hwang, Seoul (KR); Won Sic Woo, Guri-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 100 days.

(21) Appl. No.: 12/044,441

(22) Filed: Mar. 7, 2008

(65) Prior Publication Data
US 2009/0003072 A1    Jan. 1, 2009

(30) Foreign Application Priority Data
Jun. 28, 2007    (KR) ..................... 10-2007-0064382

(51) Int. Cl.
*G11C 16/04*    (2006.01)
(52) U.S. Cl. ............................. 365/185.17; 365/185.18
(58) Field of Classification Search ............ 365/185.17, 365/185.18, 185.25
See application file for complete search history.

(56) References Cited

U.S. PATENT DOCUMENTS 5,923,587 A *    7/1999    Choi ..................... 365/185.11
2008/0074927 A1*    3/2008    Hofmann et al. ....... 365/185.17

FOREIGN PATENT DOCUMENTS

KR        100204804 B1    3/1999

* cited by examiner

*Primary Examiner*—Vu A Le
(74) *Attorney, Agent, or Firm*—Townsend and Townsend and Crew LLP

(57) ABSTRACT

A non-volatile memory device is provided. In an aspect, the non-volatile memory device includes two or more common source lines that are included in one memory cell block in order to distribute the current that could have been concentrated on one common source line. As a result, the bouncing phenomenon generated by the nose of the source line can be reduced. That is, at the time of a verifying operation performed during a program operation, the current concentrated on a common source line can be distributed and, therefore, the occurrence of under-programmed cells can be prevented.

14 Claims, 6 Drawing Sheets

NON-VOLATILE MEMORY DEVICE

CROSS-REFERENCES TO RELATED APPLICATIONS

The present application claims priority to Korean patent application number 10-2007-64382, filed on Jun. 28, 2007, which is incorporated by reference in its entirety.

BACKGROUND

The present invention relates to a non-volatile memory device and, more particularly, to a non-volatile memory devices including a plurality of common source lines in order to reduce a source line bouncing phenomenon.

In recent years, there is an increasing demand for non-volatile memory devices which can be programmed and erased electrically and do not require a refresh function of rewriting data at certain intervals.

A non-volatile memory device generally includes a memory cell array in which cells for storing data are arranged in a matrix form, and a page buffer for writing memory into specific cells of the memory cell array or reading memory stored in a specific cell. The page buffer includes a bit line pair connected to a specific memory cell, a register for temporarily storing data to be programmed into the memory cell array or reading data of a specific cell from the memory cell array and temporarily storing the read data, a sense node for sensing a voltage level of a specific bit line or a specific register, and a bit line selection unit for controlling whether to connect the specific bit line and the sense node.

To correctly determine whether a specific cell has been programmed, it is important to maintain sufficient read margin, if possible. In particular, each cell of a non-volatile memory device employing a Multi-Level Cell (MLC) programming method has various threshold voltage distributions compared with cells employing a Single Level Cell (SLC) programming method. Thus, without a sufficient sensing margin placed on distribution basis, source line bouncing phenomenon is unavoidable.

However, even though a program target cell has not been fully programmed at a verify reference voltage or more due to the bouncing phenomenon of a source line, which occurs according to the characteristic of a memory cell array, under-programmed cells that are verified to be fully programmed are generated. The sensing margin is further reduced due to the existence of the under-programmed cells.

This phenomenon becomes more severe as the resistance of a common source line is increased while the process size is reduced.

SUMMARY

The present invention is directed to a non-volatile memory device including a plurality of common source lines.

A non-volatile memory device according to an embodiment of the present invention includes a source voltage generator for applying a ground voltage, a first common source line connected to a first cell string pair group that is included in a unit memory cell block. The non-volatile memory device includes a second common source line connected to a second cell string pair group that is included in the unit memory cell block. The first and second common source lines are connected to the source voltage generator.

A non-volatile memory device according to another embodiment of the present invention includes a source voltage generator for applying a ground voltage, a first common source line connected to a first cell string pair group which is included in a first memory cell block, and another first cell string pair group which is included in a second memory cell block adjacent to the first memory cell block, and connected to the source voltage generator. The non-volatile memory device includes a second common source line connected to a second cell string pair group which is included in the first memory cell block, and another second cell string pair group which is included in the second memory cell block, and connected to the source voltage generator.

A non-volatile memory device according to still another embodiment of the present invention includes a source voltage generator for applying a ground voltage, a first common source line connected to a first cell string pair group which is included in a first memory cell block, and another first cell string pair group which is included in a second memory cell block adjacent to the first memory cell block, and connected to the source voltage generator. The non-volatile memory device further includes a second common source line connected to a second cell string pair group which is included in the first memory cell block, and another second cell string pair group which is included in the second memory cell block, and connected to the source voltage generator. The non-volatile memory device includes a third common source line connected to a third cell string pair group which is included in the first memory cell block, and another third cell string pair group which is included in the second memory cell block, and connected to the source voltage generator.

DESCRIPTION

Now, specific embodiments according to the present invention will be described with reference to the accompanying drawings.

However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

Figure 1:
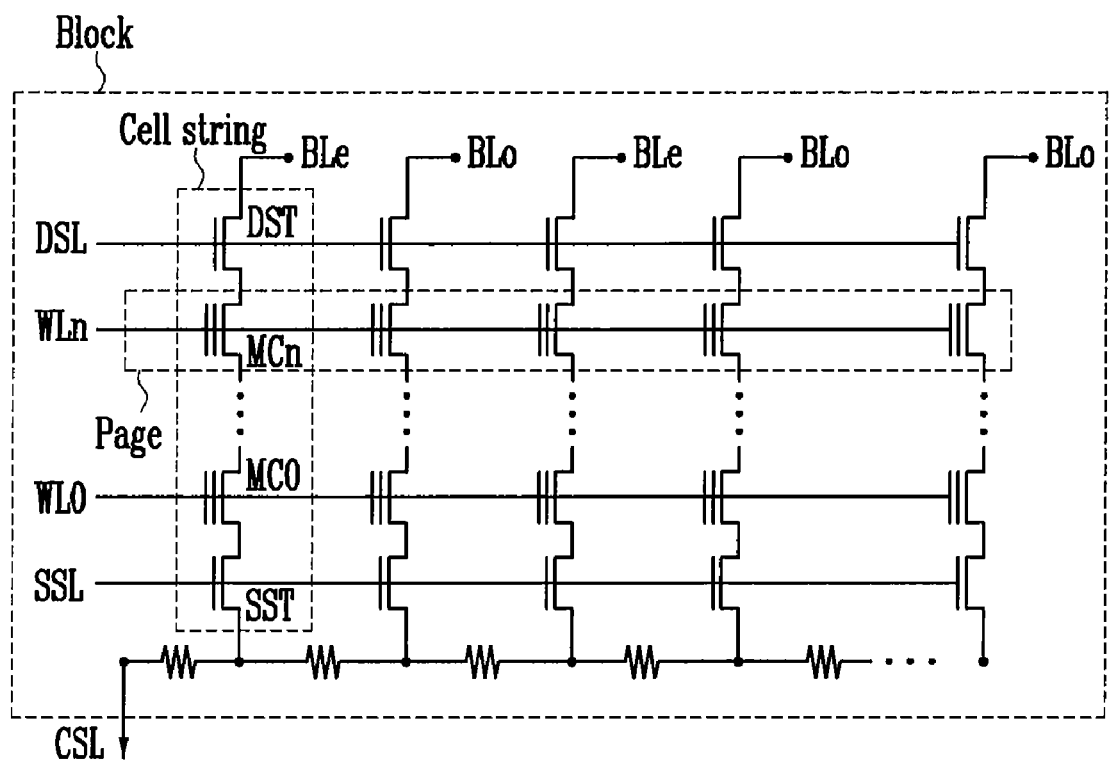
FIG. 1 is a view illustrating the structure of a typical memory cell array of a non-volatile memory device.

FIG. 1 is a view illustrating the structure of a typical memory cell array of a non-volatile memory device.

The memory cell array includes memory cells MC0 to MCn for storing data, word lines WL0, WL1, . . . , WLn for selecting and activating the memory cells, and bit lines BLe, BLo for inputting or outputting data of the memory cells. The memory cell array has a structure in which the plurality of word lines and the plurality of bit lines are arranged in a matrix form. The memory cell array includes a drain select transistor DST connected between the bit lines and the memory cells, and a source select transistor SST connected between the memory cells and a common source line CSL.

The memory cell array further includes memory cells connected in series between the source select transistor SSL and the drain select transistor DSL. This is referred to a cell string.

The gates of the memory cell are connected to the word lines. A collection of memory cells commonly connected to the same word line is referred to a page. A plurality of the cell strings connected to the respective bit lines are connected in parallel to the common source line, thus constituting a block.

Each cell string is connected to the common source line CSL, and each source line is connected to a metal bypass line (not shown) parallel to the bit lines. At this time, the source line includes a resistance component due to an n+ diffused source line. Noise is generated due to a high resistance of the source line, which has an effect on control of a threshold voltage.

The reason why the resistance of the source line has a great influence on control of a threshold voltage is that only one common source line exists within one block. Problems caused by the resistance of the source line are described below in more detail.

Figure 2A:
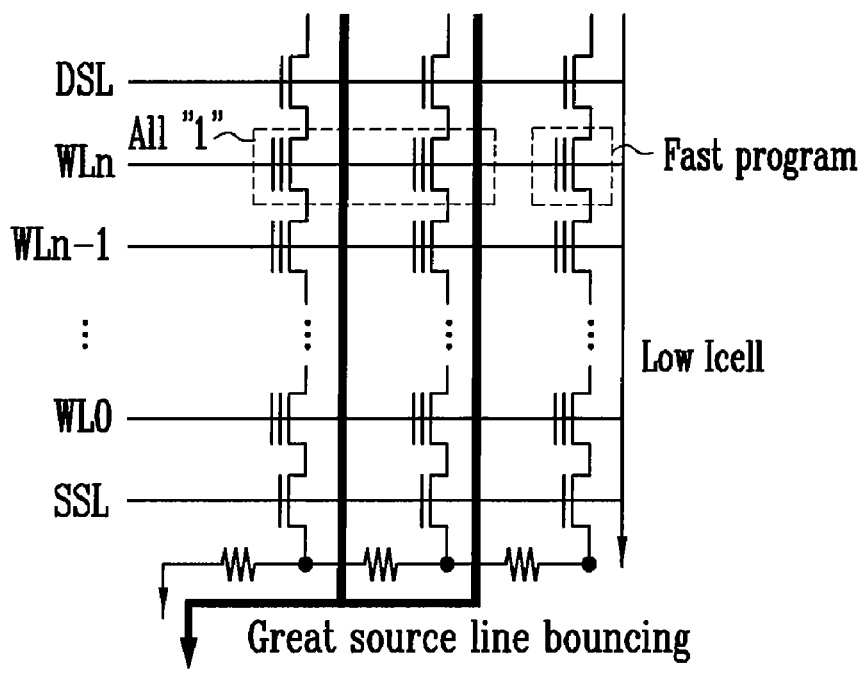
FIGS. 2A and 2B are views illustrating a source line bouncing phenomenon that occurs due to the resistance component of source lines.
Figure 2B:
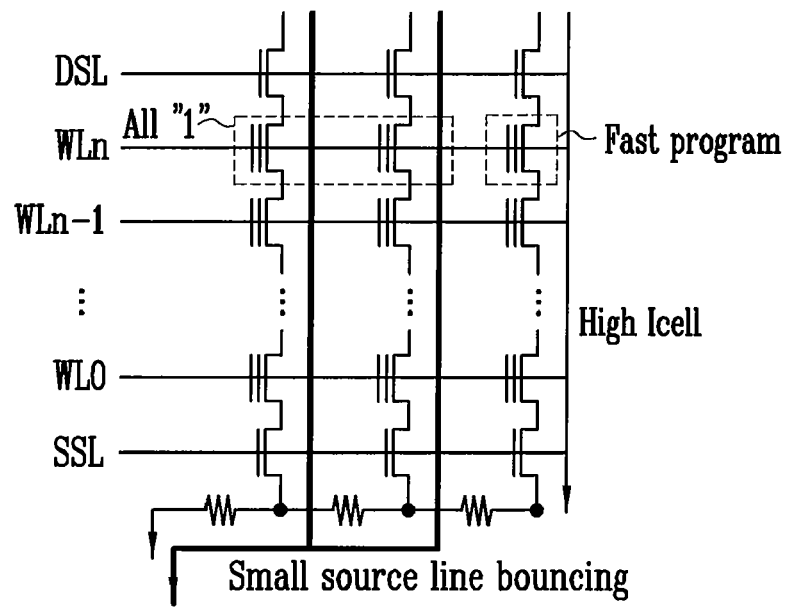

FIGS. 2A and 2B are views illustrating a source line bouncing phenomenon occurring due to the resistance component of source lines.

In FIGS. 2A and 2B, it is assumed that pages of a selected word line are all programmed. At this time, FIG. 2A includes both cells that are first programmed (that is, fast program cells) and slow programmed (i.e., slow program cells) which are subject to programming in the same word line, but not yet programmed.

The slow program cells (all indicated by "1") are discharged to a ground voltage from a precharge level since they have not yet been programmed. At this time, as the voltage of the source line rises, the source voltage of the fast program cell rises due to the resistance of the source line. Consequently, a sensing current Icell of the fast program cell is decreased due to the noise of the common source line.

Due to this reduced current, the fast program cells may pass through verification despite that a threshold voltage is higher than a verify voltage. The fast program cells are incorrectly determined to be programmed and therefore are not further programmed.

FIG. 2B shows a state where the noise of the common source line is reduced when the slow program cells are all programmed. As the noise of the common source line is reduced, the current flowing through the fast program cells is further increased.

In general, without a sufficient sensing margin placed on distribution basis, a bouncing phenomenon in which the voltage level of the source line is changed according to the program state of adjacent cells is generated. The level of the current passing through a specific cell is greatly changed due to the bouncing phenomenon. Consequently, under-programmed cells (which are incorrectly determined to be programmed) are generated.

Figure 3:
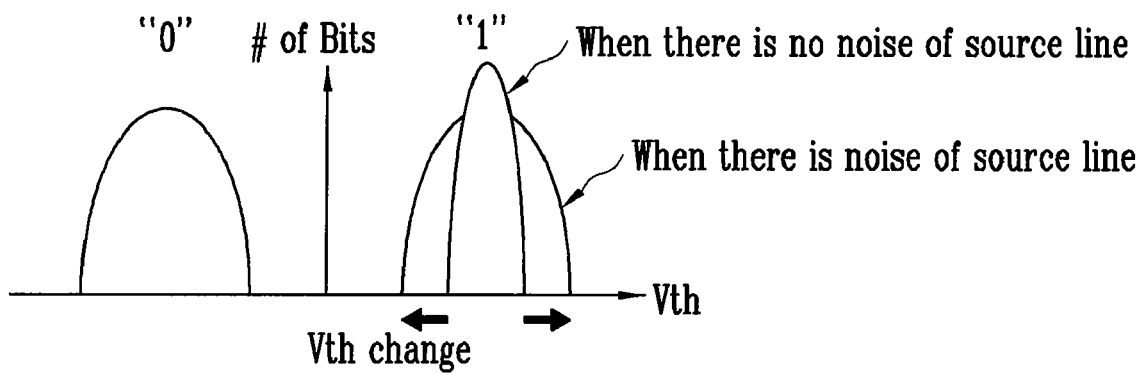
FIG. 3 is a view illustrating a variation in threshold voltage distributions according to the occurrence of the bouncing phenomenon by the source line noise.

FIG. 3 is a view illustrating a variation in threshold voltage distributions according to the occurrence of the bouncing phenomenon by the source line noise.

As shown in FIG. 3, threshold voltage distributions are very wide if the bouncing phenomenon is generated due to the noise of the source line.

A MLC programming method of storing 2-bit or more data in one cell has recently been used. Thus, it is necessary to further narrow threshold voltage distributions, which makes it harder to have a sufficient sensing margin.

Figure 4:
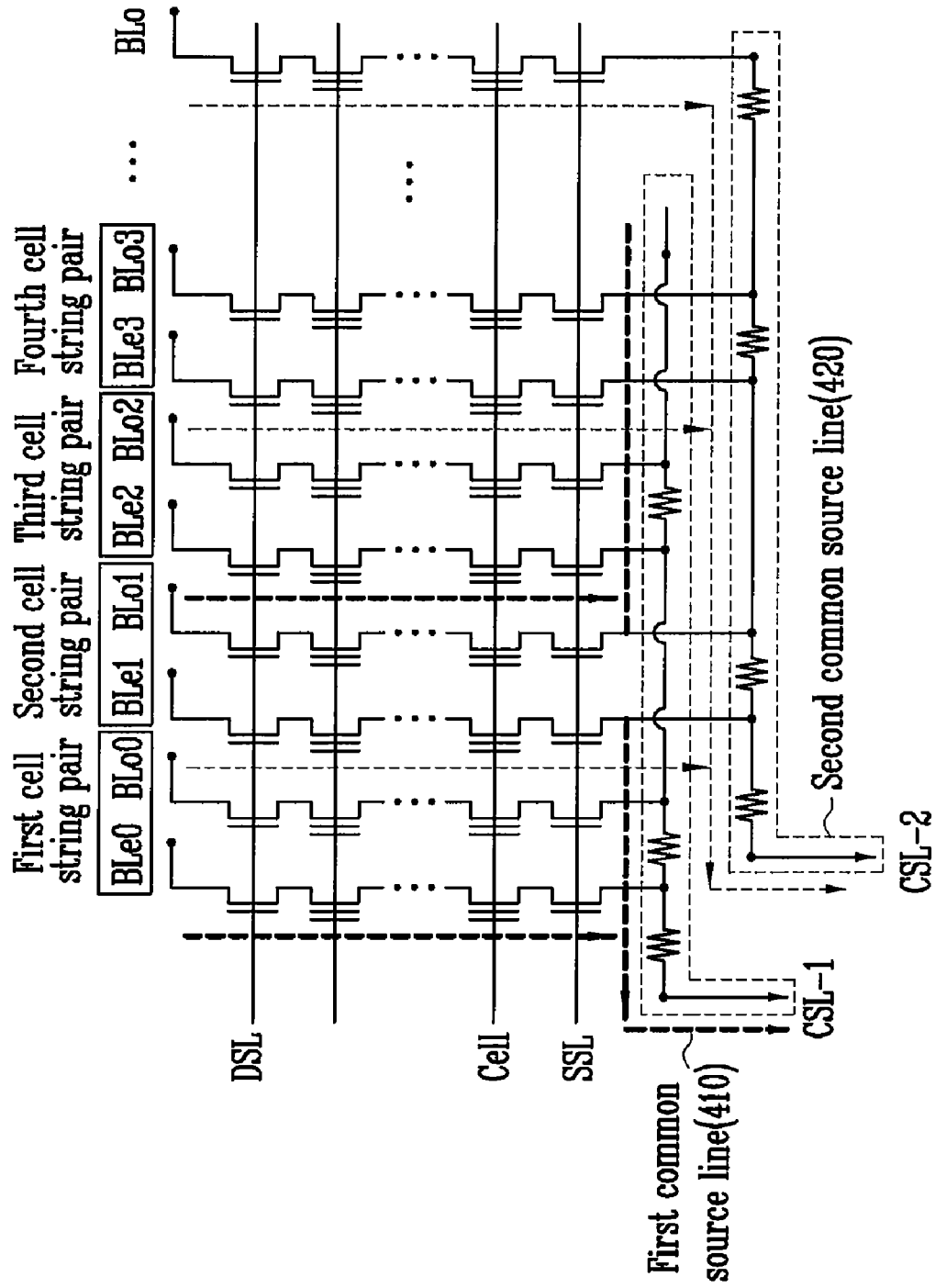
FIG. 4 is a circuit diagram of a memory cell array structure according to an embodiment of the present invention.

FIG. 4 is a circuit diagram of a memory cell array structure according to an embodiment of the present invention.

As will be discussed, in some embodiments, two or more common source lines are included in one block in order to distribute the current concentrated on one common source line. In those embodiments, the bouncing phenomenon caused by the noise of a source line can be reduced.

A cell string connected to an even bit line BLe and a cell string connected to an odd bit line BLo are collectively referred to as a cell string pair. Assuming that a total of 2n cell string pairs are included in a unit memory cell block, the 2n cell string pairs are divided into odd-numbered cell string pairs and even-numbered cell string pairs, which are then connected to different common source lines.

In other words, the odd-numbered cell string pairs (e.g., a first cell string pair, a third cell string pair, ..., a $(2n-1)^{th}$ cell string pair) are connected to a first common source line 410, and the even-numbered cell string pairs (e.g., a second cell string pair, a fourth cell string pair, ..., a $(2n)^{th}$ cell string pair) are connected to a second common source line 420, as shown in FIG. 4.

The first and second common source lines are grounded independently. As described above, in those embodiments, the current flowing through the common source lines can be distributed and the occurrence of under-programmed cells may be more prevented.

Figure 5:
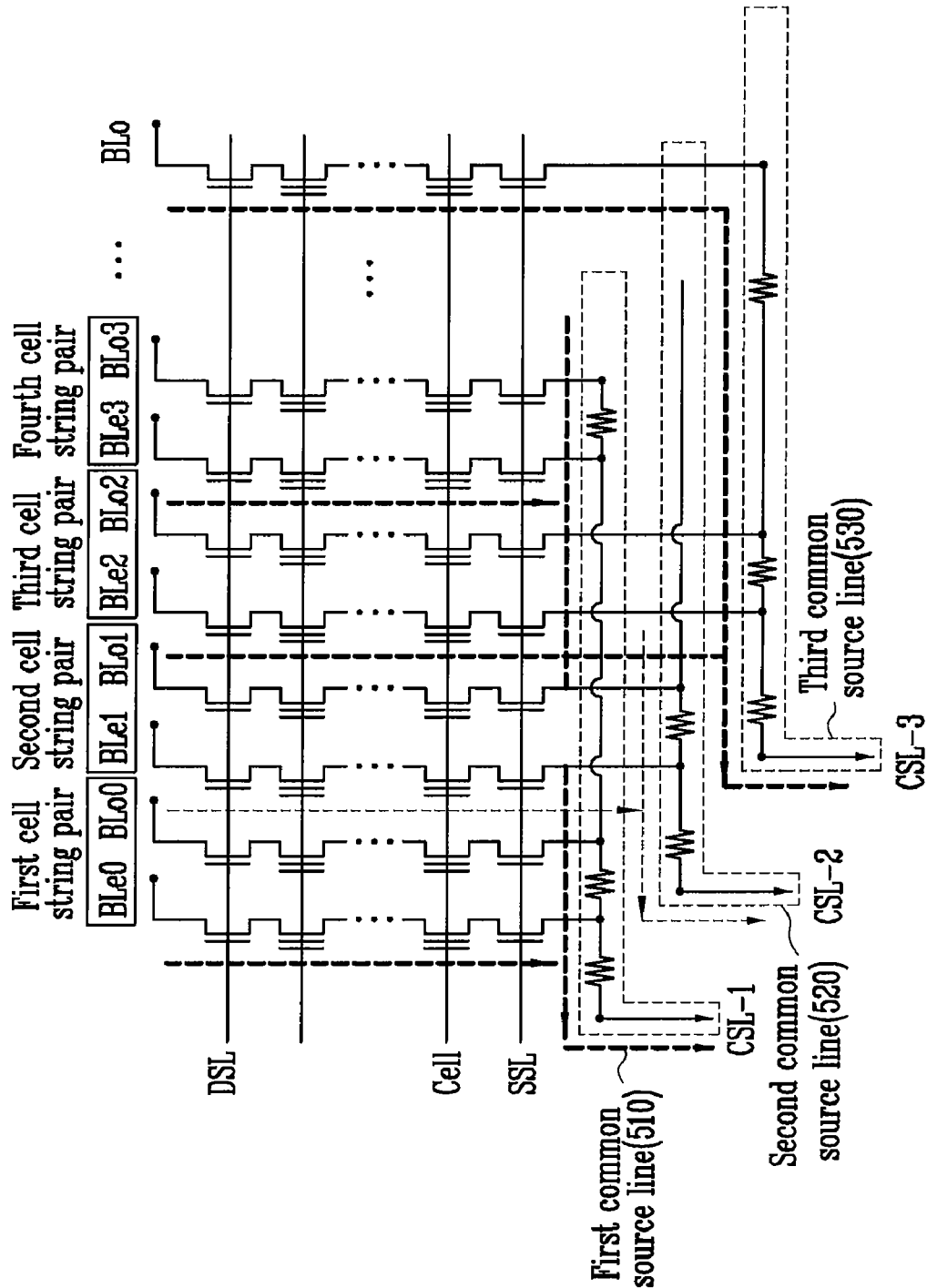
FIG. 5 is a circuit diagram of a memory cell array structure according to another embodiment of the present invention.

FIG. 5 is a circuit diagram of a memory cell array structure according to another embodiment of the present invention.

For the sake of discussion, it is assumed that a total of 3n cell string pairs are included in one block, the 3n cell string pairs are divided into $(3n-2)^{th}$ cell string pairs, $(3n-1)^{th}$ cell string pairs, and $(3n)^{th}$ cell string pairs, which are then connected to different common source lines, respectively.

In other words, the $(3n-2)^{th}$ cell string pairs (e.g., a first cell string pair, a fourth cell string pair, ..., a $(3n-2)^{th}$ cell string pair) are connected to a first common source line 510, the $(3n-1)^{th}$ cell string pairs (e.g., a second cell string pair, a fifth cell string pair, ..., a $(3n-1)^{th}$ cell string pair) are connected to a second common source line 520, the $(3n)^{th}$ cell string pairs (e.g., a third cell string pair, a sixth cell string pair, ..., a $(3n)^{th}$ cell string pair) are connected to a third common source line 530, as shown in FIG. 5.

The first to third common source lines are grounded independently.

As described above, in those embodiments depicted in FIG. 5, the current flowing through the common source lines may be well distributed.

Figure 6:
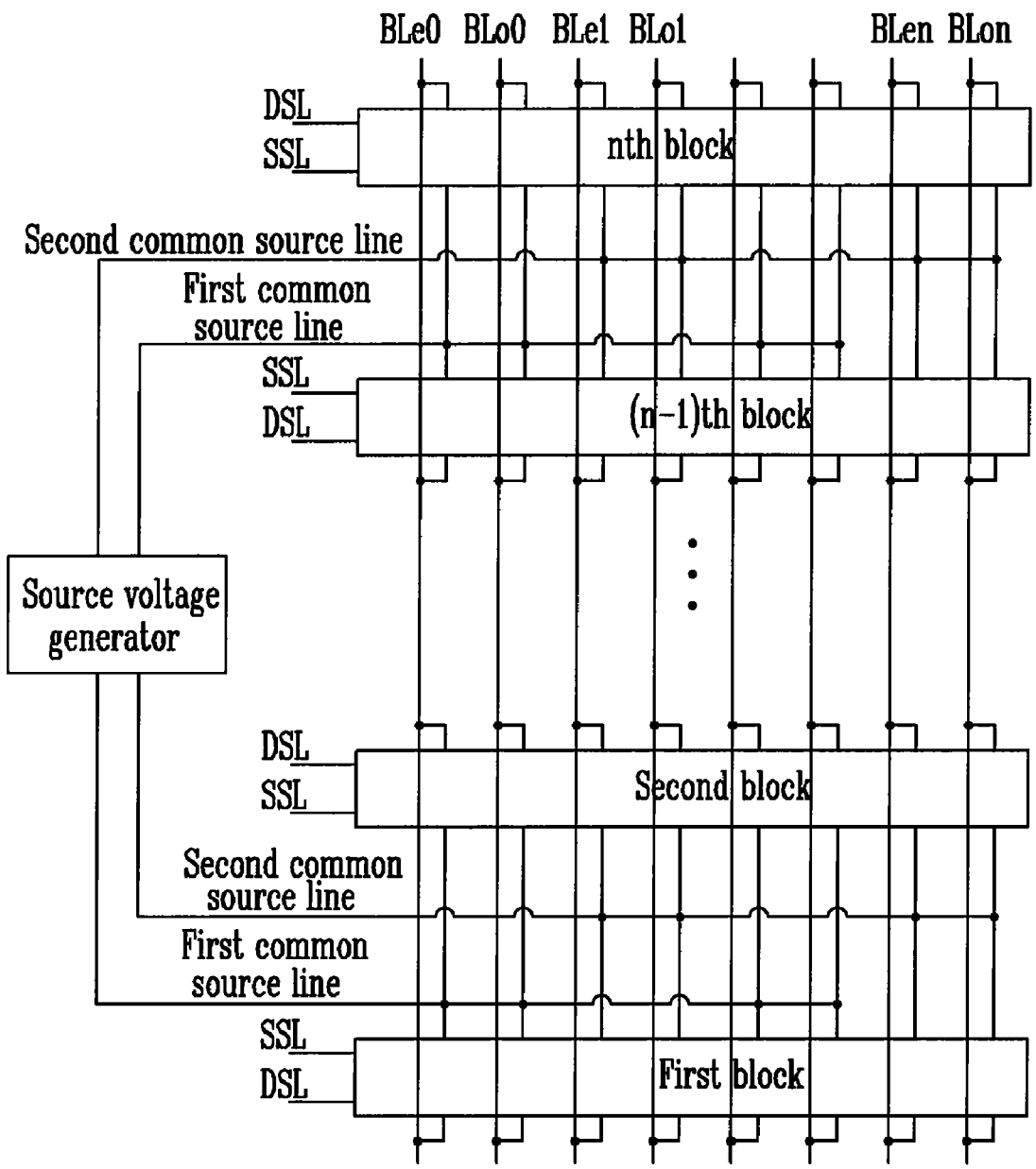
FIG. 6 is a block diagram of a memory cell array according to an embodiment of the present invention.

FIG. 6 is a block diagram of a memory cell array according to the embodiments of the present invention.

Conventionally, two adjacent blocks shared one common source line, which causes the above mentioned problems including bouncing phenomenon. In some embodiments of the present invention, two adjacent blocks share two or more common source lines. In this manner, the current flowing through the common source lines can be distributed, which prevents bouncing phenomenon, under-programmed cells, etc.

A first cell string pair of a first memory cell block and a first cell string pair of a second memory cell block share a first common source line, and a second cell string pair of the first memory cell block and a second cell string pair of the second memory cell block share a second common source line.

In a similar way, a first cell string pair of an $(n-1)^{th}$ memory cell block and a first cell string pair of an $n^{th}$ memory cell block share the first common source line, and a second cell string pair of the (n−1)$^{th}$ memory cell block and a second cell string pair of the n$^{th}$ memory cell block share the second common source line.

Meanwhile, a ground voltage is supplied to each common source line through a source voltage generator.

In the above, FIG. 6 has been described with reference to the embodiment depicted in FIG. 4 having two common source lines Alternatively, a third common source line can be further added in that embodiment as shown in the embodiment depicted in FIG. 5.

Figure 7:
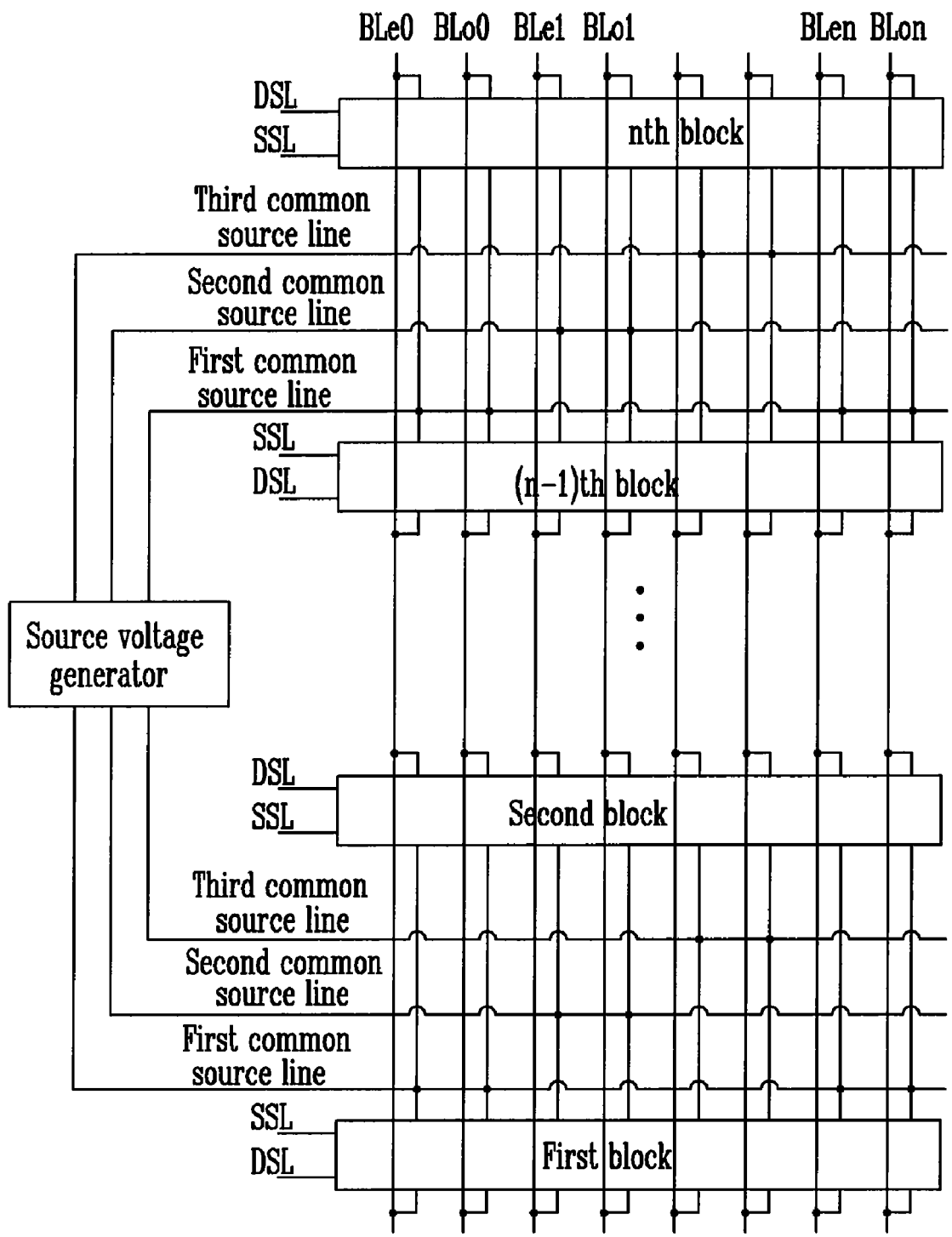
FIG. 7 is a block diagram of a memory cell array according to another embodiment of the present invention.

FIG. 7 is a block diagram of a memory cell array according to another embodiment of the present invention.

A first cell string pair of a first memory cell block and a first cell string pair of a second memory cell block share a first common source line, a second cell string pair of the first memory cell block and a second cell string pair of the second memory cell block share a second common source line, and a third cell string pair of the first memory cell block and a third cell string pair of the second memory cell block share a third common source line.

In a similar way, a first cell string pair of a (n−1)$^{th}$ memory cell block and a first cell string pair of an n$^{th}$ memory cell block share the first common source line, a second cell string pair of the (n−1)$^{th}$ memory cell block and a second cell string pair of the n$^{th}$ memory cell block share the second common source line, and a third cell string pair of the (n−1)$^{th}$ memory cell block and a third cell string pair of the n$^{th}$ memory cell block share the third common source line.

Meanwhile, a ground voltage is supplied to each common source line through a source voltage generator.

Through this construction, the current flowing through the common source lines can be distributed.

As described above, according to some embodiments of the present invention, the bouncing phenomenon generated by the nose of the source line can be reduced. That is, at the time of a verify operation performed during a program operation, the current concentrated on a common source line can be distributed and, therefore, the occurrence of under-programmed cells can be prevented.

The present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims.

What is claimed is:

1. A non-volatile memory device, comprising:
   a source voltage generator for applying a ground voltage;
   a first common source line connected to a first cell string pair group that is included in a unit memory cell block; and
   a second common source line connected to a second cell string pair group that is included in the unit memory cell block, wherein the first common source and the second common source are connected to the source voltage generator,
   wherein the first cell string pair group and the second cell string pair group are alternately arranged.

2. The non-volatile memory device of claim 1, wherein the first cell string pair group includes odd-numbered cell string pairs in the unit memory cell block.

3. The non-volatile memory device of claim 2, wherein the second cell string pair group includes even-numbered cell string pairs in the unit memory cell block.

4. The non-volatile memory device of claim 1, further comprising a third common source line connected to a third cell string pair group included in the unit memory cell block.

5. The non-volatile memory device of claim 4, wherein the third common source line is connected to the source voltage generator.

6. A non-volatile memory device, comprising:
   a source voltage generator for applying a ground voltage;
   a first common source line connected to a first group of first cell string pairs, which is included in a first memory cell block, and a second group of first cell string pairs which is included in a second memory cell block adjacent to the first memory cell block, the first common source line connected to the source voltage generator; and
   a second common source line connected to a first group of second cell string pairs, which is included in the first memory cell block, and a second group of second cell string pairs, which is included in the second memory cell block, the second common source line connected to the source voltage generator,
   wherein the first cell string pairs and the second cell string pairs are alternately arranged.

7. The non-volatile memory device of claim 6, wherein the first cell string pairs are odd-numbered cell string pairs.

8. The non-volatile memory device of claim 6, wherein the second cell string pairs are even-numbered cell string pairs.

9. A non-volatile memory device, comprising:
   a source voltage generator for supplying a ground voltage;
   a first common source line connected to a first group of first cell string pairs, which is included in a first memory cell block, and a second group of first cell string pairs, which is included in a second memory cell block adjacent to the first memory cell block, and connected to the source voltage generator;
   a second common source line connected to a first group of second cell string pairs, which is included in the first memory cell block, and a second group of second cell string pairs, which is included in the second memory cell block, and connected to the source voltage generator; and
   a third common source line connected to a first group of third cell string pairs, which is included in the first memory cell block, and a second group of third cell string pairs, which is included in the second memory cell block, and connected to the source voltage generator,
   wherein the first cell string pairs, the second cell string pairs, and the third cell string pairs are alternately arranged.

10. The non-volatile memory device of claim 2, wherein each of the odd-numbered cell string pairs include an even bit line and an odd bit line.

11. The non-volatile memory device of claim 3, wherein each of the even-numbered cell string pairs include an even bit line and an odd bit line.

12. The non-volatile memory device of claim 7, wherein each of the odd-numbered cell string pairs include an even bit line and an odd bit line.

13. The non-volatile memory device of claim 8, wherein each of the even-numbered cell string pairs include an even bit line and an odd bit line.

14. The non-volatile memory device of claim 9, wherein each of the first cell string pairs, the second cell string pairs, and the third cell string pairs include an even bit line and an odd bit line.

* * * * *